United States Patent [19]

Belot

[11] Patent Number: 5,726,651
[45] Date of Patent: Mar. 10, 1998

[54] DEVICE FOR SERIALIZING HIGH FLOW OF BINARY DATA

[75] Inventor: Didier Belot, Rives, France

[73] Assignee: SGS-Thomson Microelectronics S.A., Saint Genis, France

[21] Appl. No.: 561,517

[22] Filed: Nov. 22, 1995

[30] Foreign Application Priority Data

Nov. 30, 1994 [FR] France ................... 94 14605

[51] Int. Cl.$^6$ ........................................... H03M 9/00
[52] U.S. Cl. ................................. 341/101; 370/112
[58] Field of Search ........................ 341/100, 101

[56] References Cited

U.S. PATENT DOCUMENTS

| 3,631,464 | 12/1971 | Dahlberg | 340/347 |
| 4,418,418 | 11/1983 | Aoki | 377/79 |
| 4,965,797 | 10/1990 | Yamane et al. | 370/112 |
| 5,319,369 | 6/1994 | Maios et al. | 341/101 |
| 5,522,088 | 5/1996 | Halma et al. | 395/881 |
| 5,550,860 | 8/1996 | Georgiou et al. | 375/220 |

OTHER PUBLICATIONS

French Search Report from French Patent Application 94 14605, filed Nov. 30, 1994.

*Primary Examiner*—Marc S. Hoff
*Attorney, Agent, or Firm*—Wolf, Greenfield & Sacks, P.C.; James H. Morris

[57] ABSTRACT

A device for serializing binary data includes at least one first multiplexer controlled by a first sampling signal. The first sampling signal is provided by a divider of a phase-locked loop providing a transmission clock signal for serialized data based on a first clock signal of parallel data. The serialization device includes, up-stream from the first multiplexer, a shift register for conferring to the parallel data a delay substantially corresponding to a phase shift between the first clock signal and the first sampling signal.

26 Claims, 6 Drawing Sheets

DEVICE FOR SERIALIZING HIGH FLOW OF BINARY DATA

BACKGROUND OF THE INVENTION

1. Field of the Invention

The present invention relates to a device for serializing data, and more particularly relates to high flow data multiplexing as, for example, included in a data asynchronous transmission mode (ATM) circuit.

2. Discussion of the Related Art

In such circuits, the data to be transmitted are constituted by binary data transmitted in parallel, for example, as 8-bit words, to a serialization device.

FIG. 1 represents a conventional serialization device used in a data ATM circuit. The device 1 is controlled by a phase-locked loop (PLL) 2 which provides a clock signal CLKS for the transmission of series data and which is in phase with a clock signal CLKO at a frequency CLKP for a transmission of parallel data DATAP. For the sake of clarity, the detailed components constituting the PLL 2 are not shown. It will only be remarked that the PLL 2 receives the clock signal CLKO and that the phase of this clock frequency CLKP is compared with a frequency restored by a divider 3 which receives the signal CLKS. The clock signal CLKS is provided by a voltage-controlled oscillator (VCO) constituted, for example, by an astable multi-vibrator controlled from the output signal of a low-pass filter. Only divider 3, in this case a divider by 8, of the PLL 2 is represented in FIG. 1.

The serialization device 1 includes three multiplexers MUX1, MUX2, and MUX3 and a differential register 4 that is constituted by a D-type flip-flop. Multiplexers MUX1, MUX2 and MUX3 are multiplexers 8-to-4, 4-to-2, and 2-to-1, respectively. The whole device 1 constitutes a multiplexer 8-to-1. The sampling signals CLK1, CLK2, and CLK3 of multiplexers MUX1, MUX2, MUX3 and the clock signal CLK4 of register 4 are provided by the divider 3 of PLL 2. The frequencies of these signals correspond to the frequency of signal CLKS divided by 8, by 4, by 2, and by 1, respectively.

The data DATAP to be transmitted in parallel are provided to a first level converter 5 and are then transmitted to a data input of device 1. The data DATAP are in phase with each other. Converter 5 is designed to convert the logic levels of data DATAP provided by a CMOS circuit into levels compatible with an emitter-coupled logic (ECL) circuit which constitutes the multiplexers and which is selected because of its high transmission rate. The data signals provided by converter 5 are controlled by signals CLK1, CLK2, CLK3 and CLK4, successively, and go through multiplexers MUX1, MUX2, MUX3 and register 4. The output of register 4 constitutes the output of device 1 as a series data signal DATAS at the frequency of signal CLKS. A second level converter 6 carries out the same conversion on signal CLKP, before it enters the PLL 2, as the conversion carried out by converter 5 on data DATAP. The output CLKO from converter 6 is the result of this conversion.

In high speed applications, the input frequency CLKP of the parallel data DATAP is, for example, 77.76 MHz and the transmission frequency CLKS of the serialized data DATAS is, for example, 622.08 MHz. These frequencies are fixed by standard ITU 432 for applications at 155 or 622 Mbits/second.

A drawback of such a conventional serialization device, as shown in FIG. 1, however, lies in the time duration required by the PLL 2 to lock phase with a frequency of signal CLKO. This time duration is about 3 to 4 μs, whereas at a 622.08-Mhz frequency, the bit duration is approximately 3.2 ns. If such a device suitably operates for low frequency signals, its use for high flow transmission circuits may cause loss of information of more than one thousand consecutive data bits. Such losses may occur when the PLL 2 becomes unlocked from the frequency of signal CLKO during a transmission. If signals CLKO and CLKS are not perfectly in phase, the multiplexers controlled by signals CLK1, CLK2, and CLK3 are at risk of sampling the same data twice or of not sampling data at all. Such losses of information cause a high rate of bit errors. In addition, in conventional circuits, at each startup of the circuit, a long locking delay of the transmission frequency is required, during which no data can be transmitted. Such a delay impairs the overall speed of the circuit.

EP-A-0,346,896 describes a parallel-to-serial converter wherein the phases of input data are shifted by $\pi$ when the phases of sampling signals are inverted with respect to the phase of the input clock of the data to be serialized. The phase-shift of $\pi$ allows to serialize incoming data which are not in phase with each other. Such a converter has approximately the same drawbacks as those of the circuit of FIG. 1 because the selection between a phase-shifting or not depends on the phase-locked loop between the clocks of the parallel data and the series data.

SUMMARY OF THE INVENTION

An object of the present invention is to avoid these drawbacks by providing a device for serializing high speed parallel data which provides reliable transmission of data even when a frequency of the series data transmission is phase-shifted with respect to a frequency of incoming parallel data. Accordingly, the invention aims at providing reliable data serialization even when a PLL becomes unlocked during data transmission.

For this purpose, the present invention provides for shifting the data to be serialized by a delay corresponding to a phase-shift between a transmission frequency of the serialized data and a frequency of the incoming parallel data before multiplexing. If several multiplexer stages are used, the invention further provides for shifting the data to be multiplexed before each stage in order to synchronize the data to be multiplexed with an edge of a sampling signal.

To achieve these objects, in an embodiment of the present invention, a device is provided for serializing binary data including at least one first multiplexer controlled by a first sampling signal provided by a divider of a PLL providing a transmission clock signal for serially transmitting data in phase with a first clock signal of parallel data. The serialization device comprises, up-stream from the first multiplexer, a shift register for conferring to the parallel data a delay substantially corresponding to a phase-shift between the first clock signal and the first sampling signal.

According to another embodiment of the present invention, the shift register is constituted by a first differential register that receives parallel data and is controlled by falling edges of the first clock signal, and a second differential register controlled by rising edges of the first sampling signal.

According to yet another embodiment of the present invention, the device includes at least a second multiplexer controlled by a second sampling signal provided by the divider, a frequency of the second sampling signal being twice a frequency of the first sampling signal. The second multiplexer receives data provided by a third differential register controlled by falling edges of the second sampling signal, and the third register receives the data provided by the first multiplexer.

According to still another embodiment of the present invention, the differential registers are constituted by ECL D-type flip-flops.

According to another embodiment of the invention, the device is included in a high flow asynchronous transmission circuit.

The invention also relates to a high flow asynchronous transmission circuit of the type including a device for serializing parallel data having at least three multiplexers controlled by sampling signals originating from a PLL divider, the PLL outputting a clock signal for transmitting data serialized in correspondence with a first clock signal of incoming parallel data. Each multiplexer is associated with a differential register controlled by the sampling signal of the multiplexer to which it provides the data. The register associated with a first multiplexer receives the data issued from a fourth differential register of a shift register and the fourth differential register constitutes a second register of the shift register, the fourth register being controlled by the fourth clock signal.

According to still another embodiment of the present invention, the differential registers are respectively controlled by falling edges of the first clock signal, rising edges of a first sampling signal of the first multiplexer, falling edges of a second sampling signal of a second multiplexer, and falling edges of a third sampling signal of a third multiplexer.

According to still another embodiment of the present invention, a frequency of the first clock signal is approximately 77.76 MHz, and a frequency of the clock signal for transmission of the serialized data is approximately 622.08 MHz.

The foregoing and other objects, features, aspects and advantages of the present invention will become apparent from the following detailed description of the present invention when taken in conjunction with the accompanying drawings.

BRIEF DESCRIPTION OF DRAWINGS

For the sake of clarity, the timing diagrams of FIGS. 3–7 are not drawn to scale. Also, the same elements are designated with the same references in the various diagrams.

DETAILED DESCRIPTION

Figure 1:
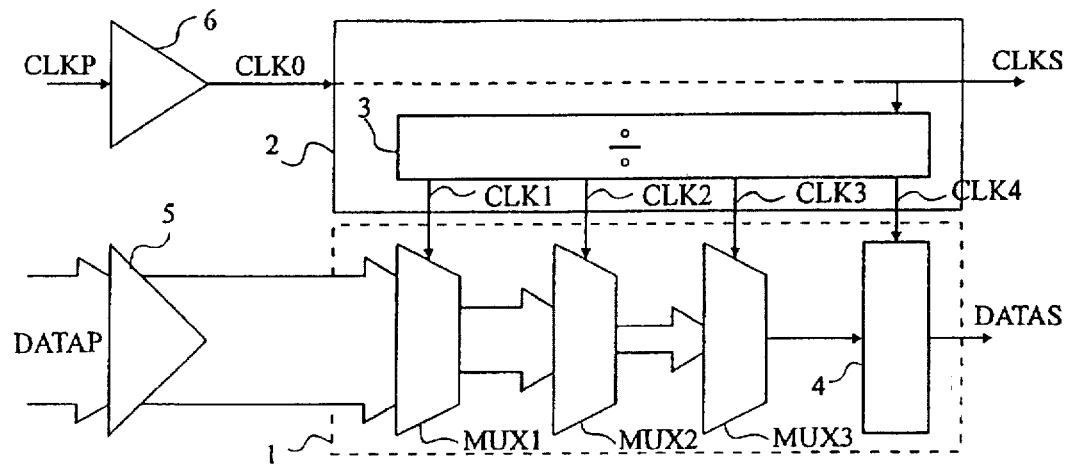
FIG. 1 represents a conventional serialization device.
Figure 2:
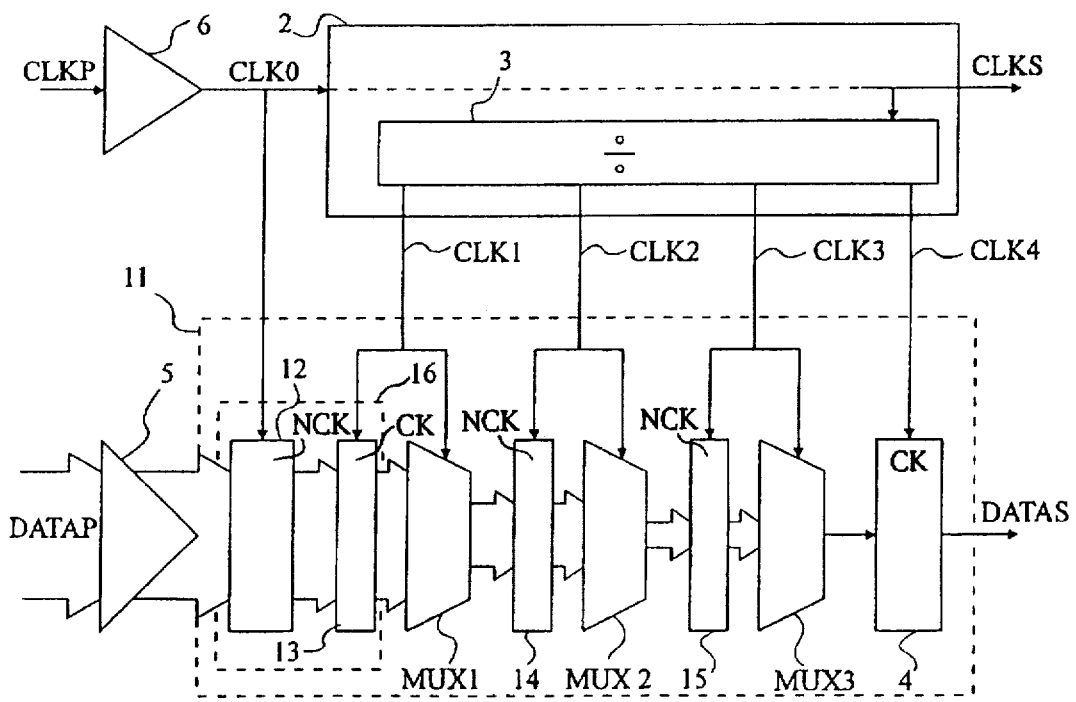
FIG. 2, represents an embodiment of a serialization device according to the present invention.

FIG. 2 represents a serialization device according to the present invention for multiplexing 8-bit parallel data words DATAP into a serialized data signal DATAS to be serially transmitted. Such a device is, for example incorporated in an ATM data circuit.

As represented in FIG. 2, a serialization device 11 according to the present invention comprises five differential registers 12, 13, 14, 15 and 4 made of D-type flip-flops and three multiplexers MUX1, MUX2, and MUX3. The signals DATAP provided by a first level converter 5 successively pass through the flip-flops of registers 12 and 13, multiplexer MUX1, the flip-flops of register 14, multiplexer MUX2, the flip-flops of register 15, multiplexer MUX3 and the flip-flop of register 4. The signals DATAP are in phase with each other.

Multiplexers MUX1, MUX2, and MUX3, as previously described above, multiplex by 8-to-4, 4-to-2, and 2-to-1, respectively. In practice, all the multiplexers are, for example, constituted by associating 2-to-1 multiplexers. The respective selection inputs of the multiplexers are, as previously described, controlled by sampling signals, CLK1, CLK2, and CLK3, respectively, provided by a divider 3 of a PLL 2. The divider 3 is preferably a synchronous divider, i.e., signals CLK1, CLK2, and CLK3 are synchronous. However, these signals are in advance of phase with respect to signal CLK4 or CLKS by a propagation delay in the D flip-flops which constitute the first stage of the divider 3.

Registers 12 and 4 are controlled by clock signals CLK0 and CLK4, respectively. Signal CLK0 corresponds to the clock signal CLKP indicating the arrival of the parallel data DATAP and is converted so as to be compatible with an ECL circuit by a second level converter 6. Signal CLK0 is transmitted to the inverting clock input NCK of the D flip-flops of register 12. In other words, D flip-flops are controlled by falling edges of signal CLK0. Signal CLK4 corresponds to the clock signal CLKS indicating the transmission of serialized data and is transmitted to the non-inverting clock input CK of the flip-flop of register 4.

Registers 13, 14 and 15 are controlled by signals CLK1, CLK2 and CLK3, respectively. Signal CLK1 corresponds to the clock signal CLK4 divided by 8 and is transmitted to the non-inverting clock inputs CK of the flip-flops of register 13. Signal CLK2 corresponds to the clock signal CLK4 divides by 4 and is transmitted to the inverting clock inputs NCK of the flip-flops of register 14. Signal CLK3 corresponds to the clock signal CLK4 divided by 2 and is transmitted to the inverting clock inputs NCK of the flip-flops of register 15. Accordingly, registers 14 and 15 are controlled by the falling edges of signals CLK2 and CLK3, respectively, whereas register 13 is controlled by the rising edges of signal CLK1.

Registers 12 and 13 constitute a shift register 16 for the data signals DATAP before they are provided to multiplexer MUX1.

According to an alternative embodiment (not shown), all the control signals of the flip-flops constituting the registers 12, 13, 14, 15, and 4 are inverted, i.e., registers 12, 14 and 15 are controlled by the rising edges of signals CLK0, CLK2 and CLK3, respectively, and registers 13 and 4 are controlled by the falling edges of signals CLK1 and CLK4, respectively.

FIGS. 3–7 illustrate the operation of a device according to the invention such as represented in FIG. 2.

FIGS. 3–6 also illustrate the delays provided by each element of the device to the data signals DATAP present at the input of converter 5 during a signal period CLKP.

For the sake of clarity, it is assumed, in the timing diagrams of FIGS. 3–6, that the data signals DATAP are 4-bit signals D0, D1, D2, and D3, respectively. Thus, it is assumed that the device such as represented in FIG. 2 has no register 15 and no multiplexer MUX3, and that divider 3 is a divider by 4. It is also assumed that the output of multiplexer MUX2 is directly transmitted to the flip-flop of register 4 providing signal DATAS, multiplexers MUX1 and MUX2 then being 4-to-2 (two multiplexers 2-to-1) and 2-to-1 multiplexers, respectively. In addition, it is assumed, that each multiplexer selects on a rising edge of its respective sampling signal the data present on its respective first input.

In all of the timing diagrams of FIGS. 3–6, the various data signals are represented only during the periods that are useful for the sake of understanding the invention. Of course, these signals are permanently present during transmission but their states (symbolized by a cross) before and after the useful periods of the disclosure are ignored.

Figure 3:
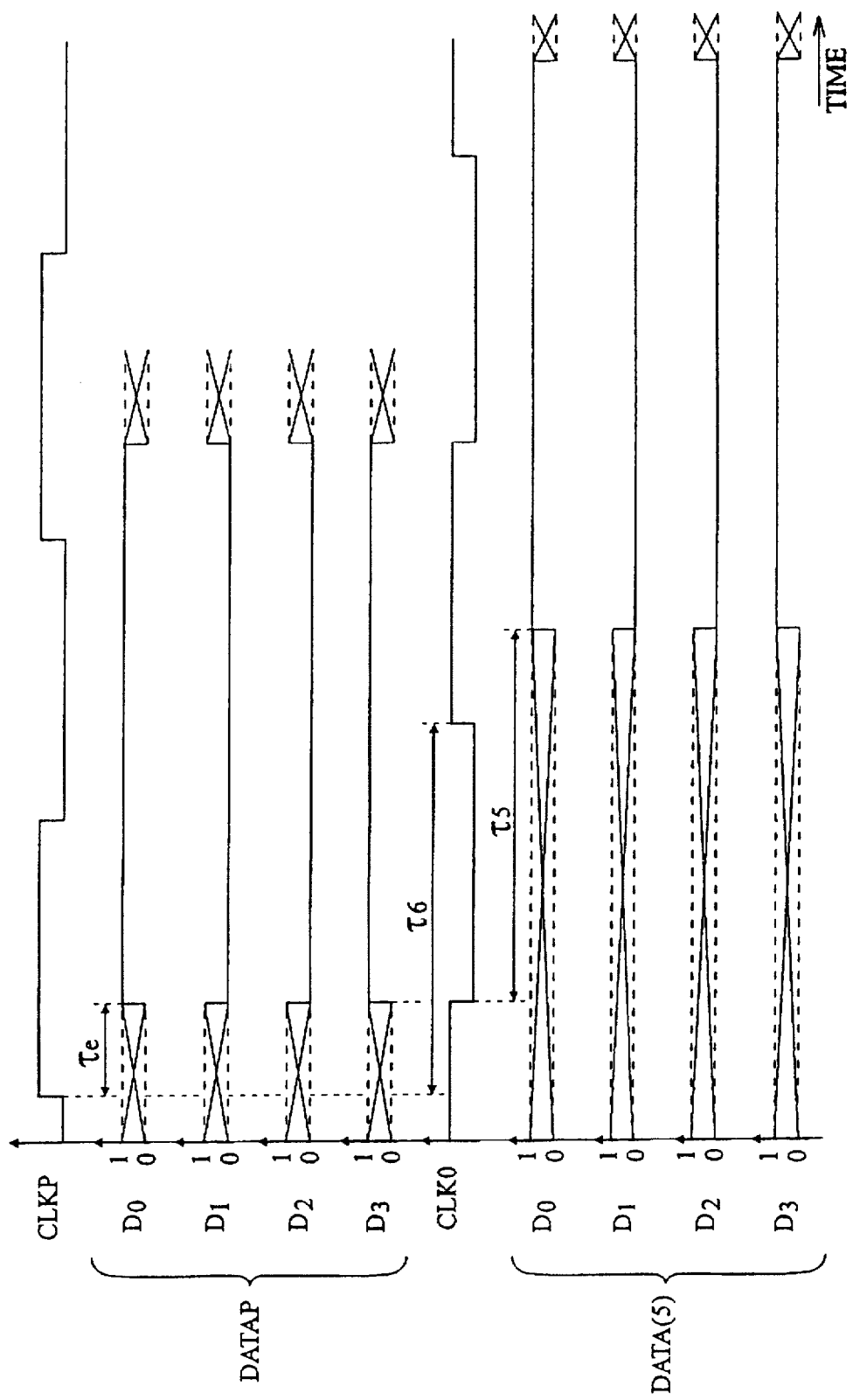
FIGS. 3–7, are timing diagrams of the operation of the serialization device represented in FIG. 2.

FIG. 3 represents signals CLKP, DATAP, CLK0 and DATA(5), where DATA(5) designates signals D0, D1, D2 and D3 at the output of converter 5.

The four bits D0, D1, D2 and D3 of signal DATAP are, for explaining the disclosure, positioned at 1, 0, 0 and 1, respectively, during a clock period CLKP represented in FIG. 3.

The data signals DATAP have, with respect to signal CLKP, a delay τe caused by the propagation delay in the various components through which these signals pass before they are provided to converter 5 or 6, respectively. The crossing by signals DATAP and CLKP of converters 5 and 6, respectively, causes a respective delay τ5 and τ6 of the output signals of converters 5 or 6, of data signals DATA(5) and of clock signal CLK0, respectively. Thus, data DATA(5) are delayed with respect to signal CLK0 by τ5+τe−τ6. In practice, converters 5 and 6 are identical and their respective propagation delays τ5 and τ6 are equal.

Figure 4:
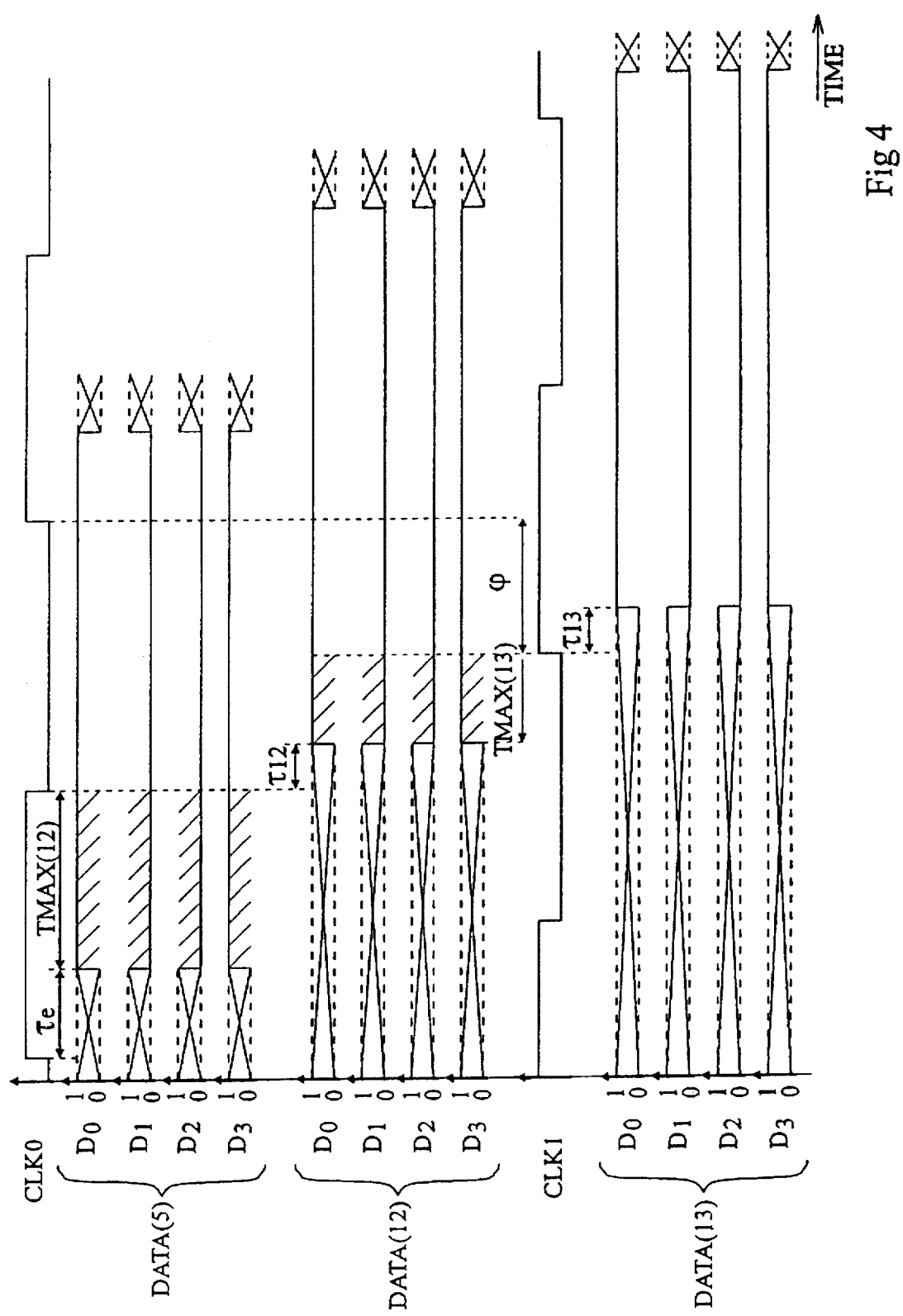

FIG. 4 illustrates the operation of the shift register 16, and represents signals CLK0, DATA(5), DATA(12), CLK1, and DATA(13), where DATA(12) and DATA(13), respectively, designate signals D0, D1, D2 and D3 at the outputs of registers 12 and If τ5=τ6, the data signals DATA(5) arrive at the shift register 16 with a delay τe with respect to the clock signal CLK0. The first register 12 of the shift register 16 is controlled by the falling edges of signal CLK0. Thus, signals DATA(12) are delayed, with respect to signal CLK0, by a half-period of signal CLK0 and by the propagation delay τ12 in the flip-flops of register 12. Signals DATA(12) are thus delayed, with respect to signals DATA(5), by a half-period of signal CLK0 and by delay τ12 decreased by delay τe.

Then, signals DATA(12) pass through register 13 which is controlled by the rising edges of signal CLK1. Signals DATA(12) are delayed with respect to signal CLK1 by the propagation delay τ13 in the flip-flops of register 13. If the PLL 2 is not locked on the frequency of signal CLK0, signals DATA(13) are then delayed, with respect to signals DATA(12), by a half-period of signal CLK0 and by the delay τ13 decreased by delay τ12 and by the phase shift φ of signal CLK0 with respect to signal CLK1. The phase shift φ is considered as positive if signal CLK1 is in advance of phase with respect to signal CLK0 as represented in FIG. 4.

Signals DATA(13) constitute, according to the invention, the signals to be serialized. The delay of signals DATA(13) with respect to signals DATA(5) corresponds to a period of signal CLK0 decreased by the phase shift φ and delays τ12 and τ13.

A characteristic of the invention is that, when the PLL 2 is unlocked, the signals of data to be serialized DATA(13) include the information on the phase shift φ between signals CLK0 and CLK1.

In practice, the D flip-flops which constitute registers 12 and 13 are identical so that the propagation delays τ12 and τ13 are equal.

Figure 5:
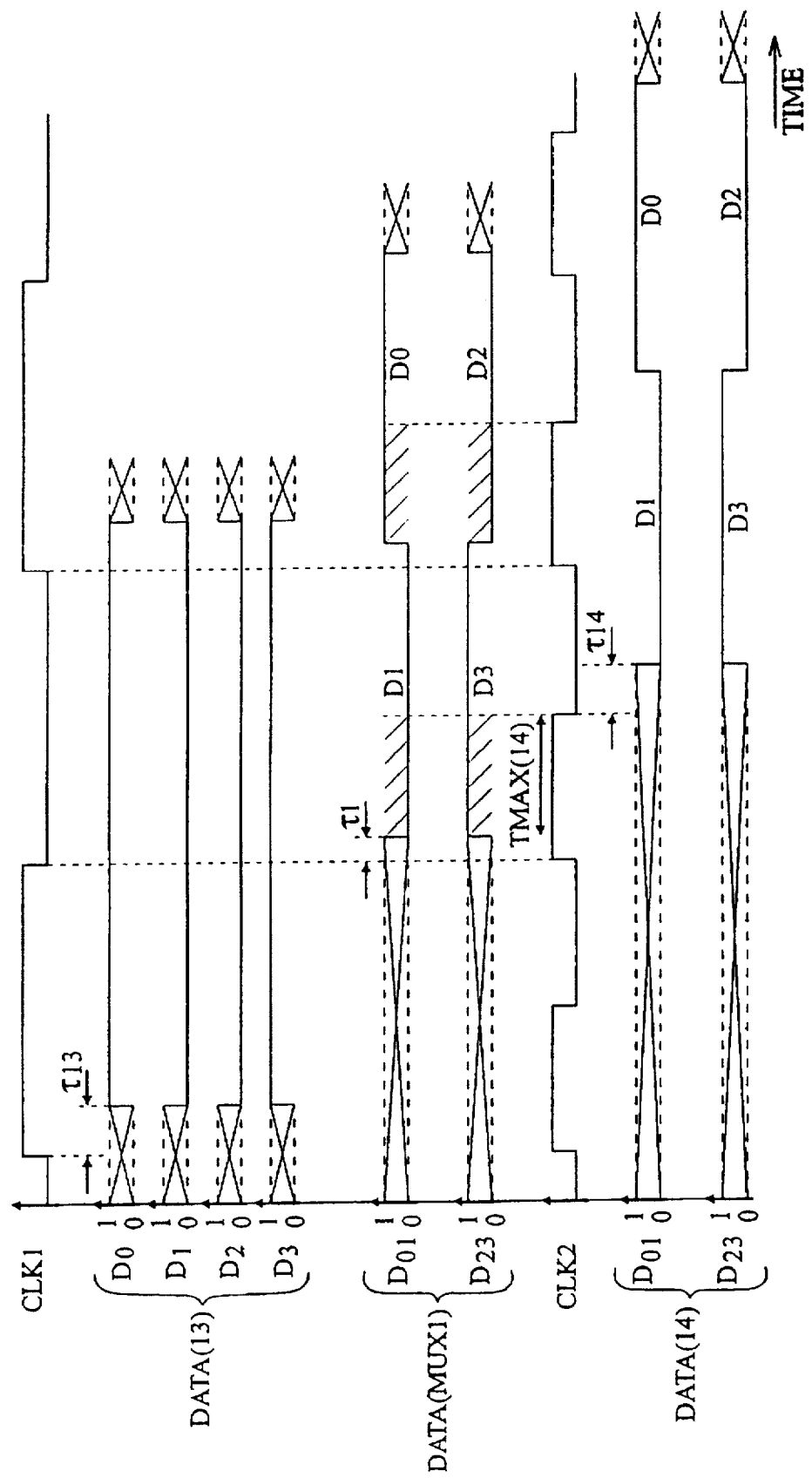
Figure 6:
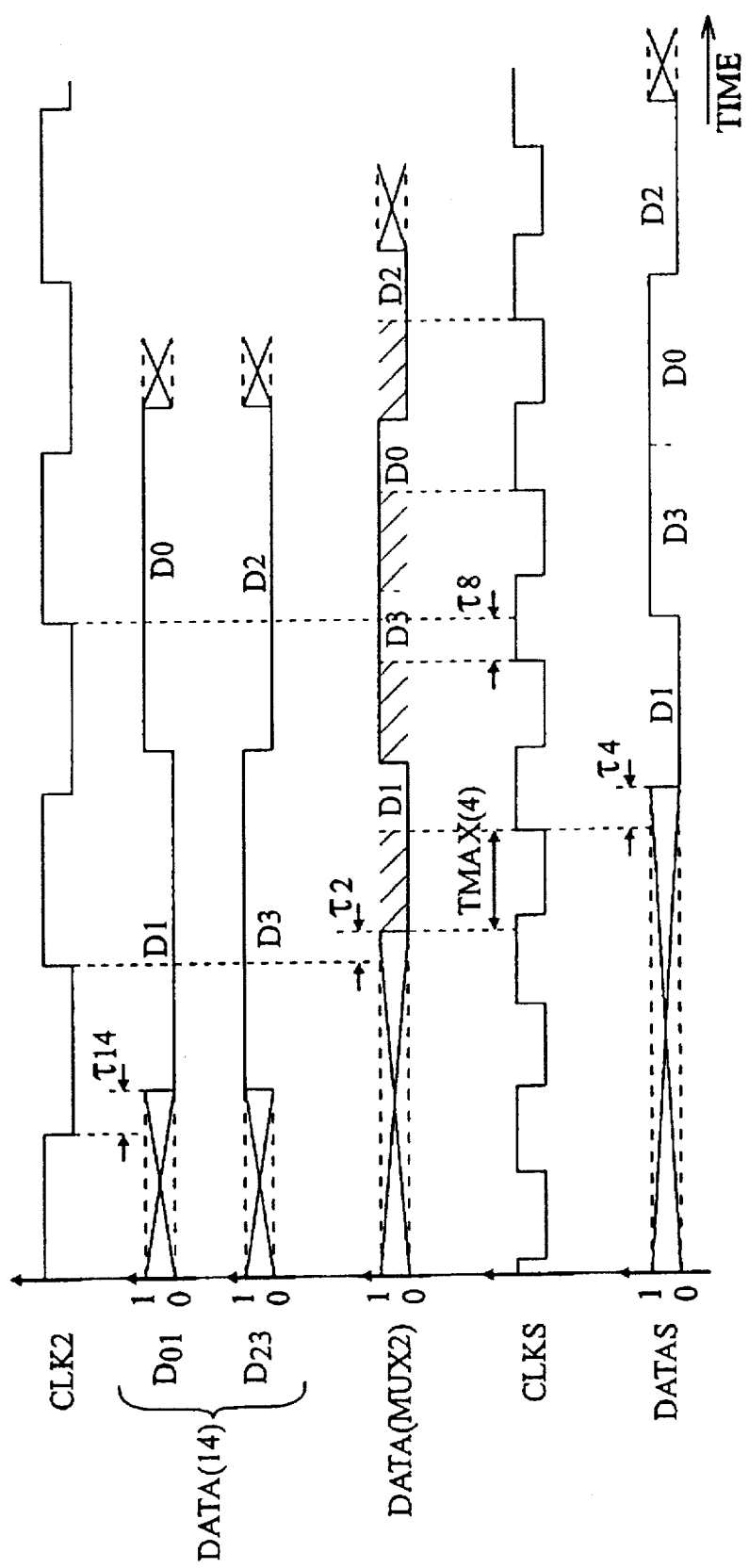

FIGS. 5 and 6 illustrate the data serialization. FIG. 5 represents signals CLK1, DATA(13), DATA(MUX1), CLK2, and DATA(14), where DATA(MUX1) and DATA (14) designate signals D01, D23 that are present at the output of multiplexer MUX1 and register 14, respectively. Signals D01 and D23 represent the resulting multiplexing of signals D0, D1, D2 and D3. FIG. 6 represents signals CLK2, DATA(14), DATA(MUX2), CLKS and DATAS, where DATA(MUX2) designates the signal at the output of multiplexer MUX2.

The signals DATA(MUX1) are delayed with respect to the signal CLK1 by a delay τ1 which corresponds to the propagation delay in multiplexer MUX1. Depending upon the width of the phase shift φ, the first edge of signal CLK1 following the occurrence of the current data DATA(13) at the input of multiplexer MUX1 is a falling or rising edge. Signals DATA(MUX1) may be further delayed by a half-period of signal CLK1 but this does not affect the operation of the device. In other words, the first data of signals D01 and D23 are either D0 and D2, or D1 and D3, depending upon the width of the phase shift φ.

Signals DATA(MUX1) pass through register 14 which is controlled by the falling edges of signal CLK2. Thus, signals DATA(14) are delayed, with respect to signal CLK2, by a half-period of signal CLK2 and by the propagation delay τ14 in the flip-flops of register 14. Since signal CLK1 is synchronized with signal CLK2, signals DATA(14) are delayed, with respect to signals DATA(MUX1), by a half-period of signal CLK2 and by the delay τ14 decreased by delay τ1.

Signals D01 and D23 provided by register 14 are then multiplexed (FIG. 6) by signal CLK2. Thus, the output signal DATA(MUX2) of multiplexer MUX2 corresponds to the serialization of data D1, D3, D0 and D2. The signal DATA(MUX2) is delayed with respect to signal CLK2 by a delay τ2 corresponding to the propagation delay through multiplexer MUX2.

The role of register 14 is to synchronize the data signals with a falling edge of signal CLK2. Thus, at each multiplexing stage, the data are synchronized back with an edge of the sampling signal and multiplexing is carried out on the next edge.

Last, signal DATA(MUX2) goes through register 4 which is controlled by the rising edges of signal CLK4 at the frequency of signal CLKS. Thus, signal DATAS is delayed with respect to signal CLKS, by a half-period of signal CLKS and by the propagation delay τ4 in the flip-flop of register 4. In addition, signal CLKS is in advance of phase with respect to signal CLK2 by the propagation delay τ8 in the first stage of flip-flops of divider 3. Signals DATAS are then delayed, with respect to signals DATA(MUX2), by one period of signal CLKS and by delay τ4 decreased by delays τ2 and τ8.

The above-mentioned reasoning can be transposed to a serialization of parallel data of 8 bits or more.

One advantage of the present invention is to allow a reliable serialization of the data even when the PLL 2 is unlocked during transmission. Thus, the bit error rate of an asynchronous transmission circuit is substantially decreased. In addition, the delay required for the starting of the circuit is decreased because the frequencies no longer need to be locked before data begin to be transmitted. The circuit according to the present invention provides a reliable transmission of data as soon as the phase shift between the frequency CLK1 and frequency CLK0 is smaller than approximately a half-period of frequency CLKP.

Figure 7:
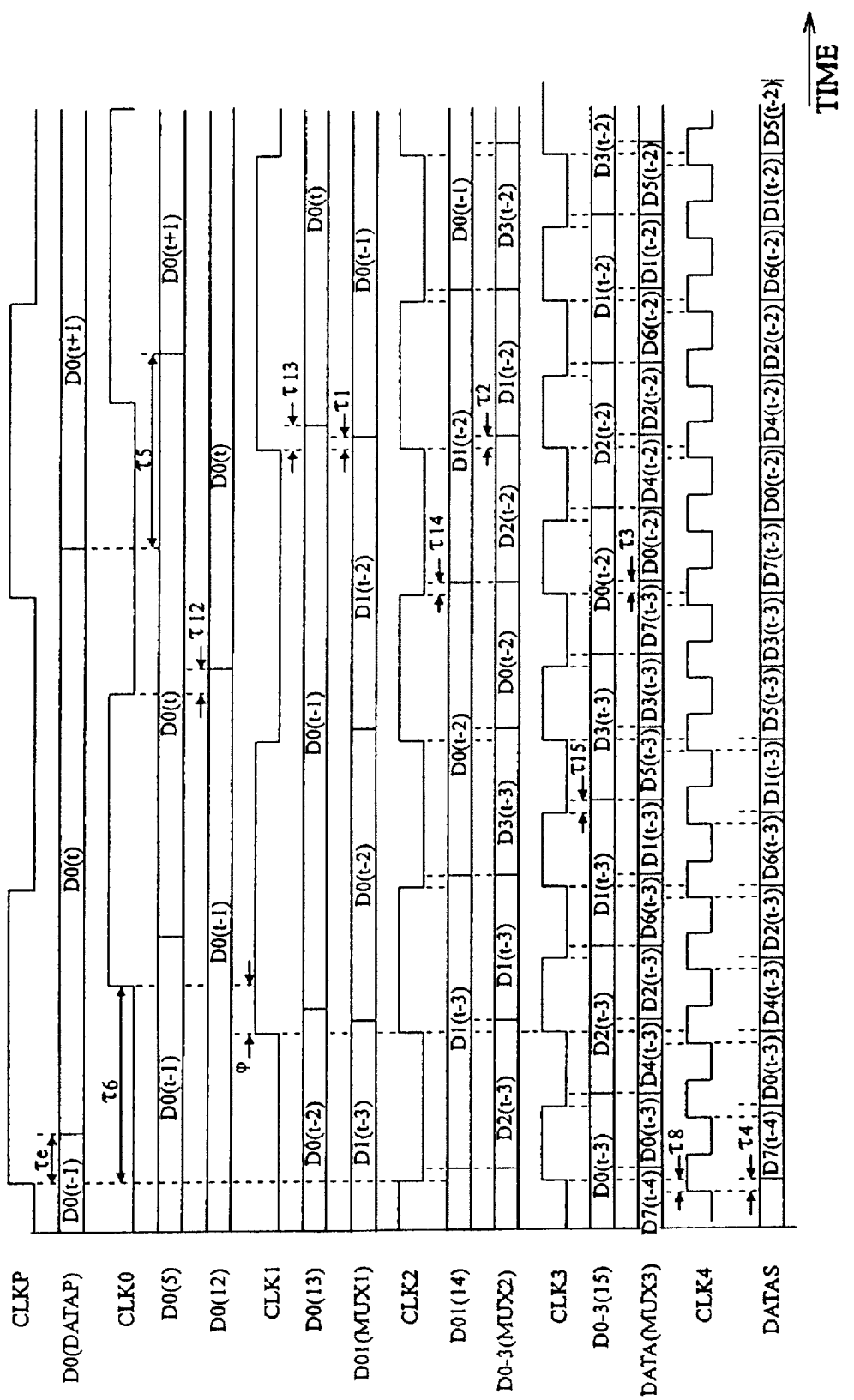

FIG. 7 represents the data present at the outputs of the various elements of the device represented in FIG. 2 during a predetermined time range of signal CLKP. FIG. 7 represents timing diagrams of the same signals as in FIG. 3–6 but within a fixed time range of signal CLKP, the signals being completed for an 8-bit serialization. The data signals are represented as portions in which data D0 to D7 have a time index t which represents the period of signal CLKP from which data D0–D7 are issued. For the sake of simplification, only one data signal is represented (D0, D01, D0–3) when all the signals associated thereto (D1–D7, D23–D67, D4–7) are in phase. Thus, only data signals D0 of signals DATAP, DATA(5), DATA(12) and DATA(13) are represented. Similarly, only the signals D01 of signals DATA(MUX1) and DATA(14) and the signal D0–3 of signals DATA(15) are represented. FIG. 7 shows the propagation delays τ3 and τ15, respectively, in multiplexer MUX3 and in the flip-flops of register 15. The operation of these two elements can be deduced from the operation described for multiplexer MUX2 and register 14 with relation to FIG. 6.

To ensure optimal synchronization of the various data signals to be multiplexed, the current data should be available at the input of a predetermined register before the occurrence of a triggering clock edge, during a duration at least equal to a time Tset associated with the flip-flops of the register. Time Tset corresponds to the time during which data should be present before the occurrence of the control signal to be taken in account by a flip-flop. Also, after a triggering clock edge, the data should remain present at the input of a predetermined register for a delay at least equal to the time Thold required by the flip-flops of this register to take data into account.

The effects of these constraints on the various delays provided to the data lead to the following characteristics.

For times Tset, these characteristics are expressed as a maximum time Tmax of the flip-flops of a predetermined register and is expressed as a function of the periods of the various clock signals and of the propagation delay in the various components. The maximum times Tmax are represented in FIGS. 4–6, as hatched portions of the determined signals with which they are associated, and are designated by reference Tmax followed by the reference of the register in brackets, e.g., Tmax (12) as shown in FIG. 4. Times Tmax are as follows:.

Tmax(12)=T(CLK0)/2−τe;

Tmax(13)=T(CLK1)/2−τ12−φ; and

Tmax(14)=T(CLK2)/2−τ1.

In case of a 4-bit serialization:

Tmax(4)=T(CLKS)−τe−τ8.

In case of an 8-bit serialization:

Tmax(15)=T(CLK3)/2−τ2; and

Tmax(4)=T(CLK4)−τ3−τ8.

For times Thold, the characteristics are expressed as the minimum time interval Δt during which data should remain present at the input of a predetermined register before the occurrence of the next triggering edge of the flip-flops of this register. This interval corresponds to a minimum interval between two data of the same signal. The intervals Δt are expressed as a function of the periods of the various clock signals, of the propagation delays in the various components and of times Thold of the flip-flops of the registers with which they are associated. Times Δt are as follows:

Δt(12)=T(CLK0)/2−Thold(12);

Δt(13)=T(CLK1)/2−φ−Thold(13); and

Δt(14)=T(CLK2)/2−Thold(14).

In case of a 4-bit serialization,

Δt(4)=T(CLKS)/2−τ8−Thold(4).

In case of an 8-bit serialization:

Δt(15)=T(CLK3)/2−Thold(15); and

Δt(4)=T(CLK4)/2−τ8−Thold(4).

The maximum times of Thold, represented as Thmax, of the various flip-flops which constitute the registers can be deduced from the fact that for each flip-flop, Δt=Tmax+Thmax. Thus, times Thmax are as follows:

Thmax(12)=τe/2;

Thmax(13)=τ12/2; and

Thmax(14)=τ1/2.

In case of a 4-bit serialization:

Thmax(4)=τ2/2.

In case of an 8-bit serialization:

Thmax(15)=τ2/2; and

Thmax(4)=τ3/2.

These various constraints on times Tset and Thold can be met with conventional flip-flops and multiplexers.

The operative limit of the device according to the invention for the phase shift φ between signals CLK0 and CLK1 is deduced from the maximum time Tset of register 13. Indeed, the time Tset of register 13 must be shorter than T(CLK0)/2−τ12−φ, which requires that the maximum shift φmax is equal to T(CLK0)/2−τ12−Tmax(13).

Thus, the data can be transmitted after the starting of the circuit as soon as the phase shift φ is shorter than T(CLK0)/2−τ12−Tmax(13). Subsequently, only the characteristics of the flip-flops constituting the shift register 16 limit the phase shift beyond which data are at risk of being transmitted in an unreliable way.

The reliable serialization of data, even when the PLL is unlocked, is a further advantage as regards the current consumption of the transmission circuit. Whereas in conventional circuits the PLL should operate permanently to prevent a delay from locking the frequencies before each serialization, the invention stops the PLL outside the periods when a signal of parallel data is transformed into series data.

In practice, all the multiplexers are preferably achieved from identical 2-to-1 multiplexers so that the propagation delays τ1, τ2 and τ3 are the same. Similarly, the flip-flops which constitute registers 14, 15 and 4 and the first stage of divider 3 are preferably similar so that the propagation delays τ14, τ15, τ4 and τ8 are the same.

By way of an exemplary embodiment of an ATM circuit at 622.08 MHz, conventional converters, flip-flops and multiplexers having the following characteristics can be used.

Converters 5 and 6 are constituted by converters from CMOS level to an ECL level whose maximum propagation delay τ is approximately 4.5 ns.

The flip-flops of registers 12 and 13 are constituted by flip-flops at 155 MHz whose maximum propagation delay is approximately 400 ps, whose maximum time Tset is approximately 30 ps and whose time Thold is shorter than 1 ps. The flip-flops of divider 3 and of registers 14, 15 and 4 are constituted by D flip-flops at 622 MHz whose maximum propagation delay τ is approximately 300 ps, whose maximum time Tset is approximately 50 ps and whose time Thold is shorter than 1 ps.

Multiplexers MUX1, MUX2 and MUX3 are constituted by 2-to-1 multiplexers whose maximum propagation delay τ is approximately 250 ps.

With such components, the maximum phase shift φmax that the device can withstand between signals CLK0 and CLK1 without impairing the data serialization; even when the PLL 2 is unlocked, is approximately 6.00 ns whereas the period of signal CLK0 is approximately 12.86 ns. Thus, even for a phase shift of ±168°, the device according to the invention allows a reliable data serialization.

As is apparent to those skilled in the art, various modifications can be made to the above disclosed preferred embodiments. In particular, each described component can be replaced with one or more components having the same function. Moreover, although the present description has been made for an 8-bit serialization of parallel data, the invention can be applied without modification independently of the number of parallel bits constituting the word to be serialized.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A serialization device for serializing binary data comprising:
   a shift register which receives parallel data and outputs delayed parallel data;
   a first multiplexer controlled by a first sampling signal provided by a divider of a phase-locked loop (PLL), the PLL outputting a transmission clock signal for serialized data in phase with a first clock signal for parallel data; and
   means for receiving the delayed parallel data and outputting serialized binary data;
   wherein a value of the delay conferred by the shift register is a function of a value of a phase-shift $\phi$ between the first clock signal and the first sampling signal.

2. The serialization device of claim 1, wherein said shift register comprises:
   a first differential register that receives the parallel data and is controlled by falling edges of said first clock signal; and
   a second differential register controlled by rising edges of said first sampling signal and which receives parallel data from the first differential register.

3. The serialization device of claim 2, further comprising:
   a third differential register controlled by falling edges of a second sampling signal provided by said divider, a frequency of said second sampling signal being twice a frequency of said first sampling signal, said third differential register receiving data provided by said first multiplexer; and
   a second multiplexer receiving data from said third differential register, the second multiplexer controlled by said second sampling signal.

4. The serialization device of claim 3, wherein each of said first, second and third differential registers comprises ECL D-type flip-flops.

5. The serialization device of claim 4, wherein said serialization device serializes binary data in connection with a high flow asynchronous transmission circuit.

6. The serialization device of claim 3, wherein said serialization device serializes binary data in connection with a high flow asynchronous transmission circuit.

7. The serialization device of claim 2, wherein said serialization device serializes binary data in connection with a high flow asynchronous transmission circuit.

8. The serialization device of claim 1, further comprising:
   a first differential register controlled by falling edges of a second sampling signal provided by said divider, a frequency of said second sampling signal being twice a frequency of said first sampling signal, said first differential register receiving data provided by said first multiplexer; and
   a second multiplexer receiving data from the first differential register, the second multiplexer controlled by the second sampling signal.

9. The serialization device of claim 1, wherein said serialization device serializes binary data in connection with a high flow asynchronous transmission circuit.

10. A high-flow asynchronous transmission mode (ATM) circuit, comprising: a device for serializing parallel data, said device including:
    first, second and third multiplexers arranged in series and respectively controlled by first, second and third sampling signals,
    a divider of a phase-locked loop outputting a transmission clock signal for transmitting data serialized in correspondence with a first clock signal indicating an arrival of parallel data and outputting said first, second and third clock signals,
    first, second and third differential registers, respectively connected to an input of the first, second and third multiplexers, the first, second and third differential register being respectively controlled by the first, second and third sampling signals, and wherein
    the first differential register connected to the first multiplexer receives the parallel data issued from a fourth differential register of a shift register, said fourth differential register being controlled by said first clock signal.

11. The ATM circuit of claim 10, wherein:
    said fourth differential register is controlled by falling edges of the first clock signal;
    said first differential register is controlled by rising edges of the first sampling signal;
    said second differential register is controlled by falling edges of the second sampling signal; and
    said third differential register is controlled by falling edges of the third sampling signal.

12. The ATM circuit of claim 11, wherein a frequency of said first clock signal is approximately 77.76 MHZ and wherein a frequency of said transmission clock signal for transmission of the serialized data is approximately 622.08 MHz.

13. The ATM circuit of claim 10, wherein a frequency of said first clock signal is approximately 77.76 MHZ and wherein a frequency of said transmission clock signal for transmission of the serialized data is approximately 622.08 MHz.

14. A device for serializing parallel data comprising:
    means for receiving a parallel data clock signal and generating a serial data clock signal, the serial data clock signal being in phase with the parallel data clock signal and a frequency of the serial data clock signal being greater than a frequency of the parallel data clock signal;
    dividing means for dividing the serial data clock signal into a first sampling clock signal having a frequency less than a frequency of the serial data clock signal;
    means for receiving the parallel data, the parallel data clock signal and the first sampling clock signal and outputting delayed parallel data, a value of the delay being a function of a value of a phase-shift $\phi$ between the parallel data clock signal and the first sampling clock signal;

first multiplexing means receiving the delayed parallel data and the first sampling clock signal for multiplexing the delayed parallel data and outputting multiplexed parallel data; and means for outputting serialized data.

15. A device as recited in claim 14 wherein the means for outputting delayed parallel data further comprises:

a first differential register controlled by the parallel data clock signal; and a second differential register controlled by the first sampling clock signal.

16. A device as recited in claim 15 wherein:

the first differential register is controlled by a falling edge of the parallel data clock signal; and the second differential register is controlled by a rising edge of the first sampling clock signal.

17. A device as recited in claim 15 wherein:

the first differential register is controlled by a rising edge of the parallel data clock signal; and the second differential register is controlled by a falling edge of the first sampling clock signal.

18. A device as recited in claim 14 further comprising:

a second multiplexing means receiving the output of the first multiplexing means and a second sampling clock signal from the dividing means and outputting serialized data, wherein the second sampling clock signal has a frequency which is twice a frequency of the first sampling clock signal.

19. A device as recited in claim 18 wherein the second multiplexing means further comprises:

a third differential register receiving data from the first multiplexing means, the third differential register controlled by a falling edge of the second sampling clock signal.

20. A method of serializing parallel data comprising the steps of:

generating a parallel data clock signal;

generating a serial data clock signal in phase with the parallel data clock signal, a frequency of the serial data clock signal being greater than a frequency of the parallel data clock signal;

generating a first sampling clock signal from the serial data clock signal, the first sampling clock signal having a frequency less than a frequency of the serial data clock signal;

receiving the parallel data and outputting delayed parallel data where a value of the delay is a function of a value of a phase shift $\phi$ between the parallel data clock signal and the first sampling clock signal; and outputting serialized parallel data.

21. The method as recited in claim 20 wherein the step of delaying the parallel data includes the step of:

shifting the parallel data on a falling edge of the parallel data clock signal and on a rising edge of the first sampling clock signal.

22. The method as recited in claim 21 further comprising the steps of:

generating a second sampling clock signal having a frequency which is twice a frequency of the first sampling clock signal; and receiving the multiplexed delayed parallel data and further multiplexing using the second sampling clock signal.

23. A method as recited in claim 21 further comprising the step of:

outputting serialized data when the phase shift $\phi$ is less than one-half a period of the parallel data clock signal.

24. A method as recited in claim 20 further comprising the step of:

outputting serialized data when the phase shift $\phi$ is less than one-half a period of the parallel data clock signal.

25. The method as recited in claim 20 further comprising the steps of:

generating a second sampling clock signal having a frequency which is twice a frequency of the first sampling clock signal; and receiving the multiplexed delayed parallel data and further multiplexing using the second sampling clock signal.

26. A method as recited in claim 22 further comprising the step of:

outputting serialized data when the phase shift $\phi$ is less than one-half a period of the parallel data clock signal.

* * * * *